(12) United States Patent
Bhat et al.

(10) Patent No.: US 8,189,639 B2
(45) Date of Patent: May 29, 2012

(54) GAN-BASED LASER DIODES WITH MISFIT DISLOCATIONS DISPLACED FROM THE ACTIVE REGION

(75) Inventors: Rajaram Bhat, Painted Post, NY (US); Dmitry Sizov, Corning, NY (US)

(73) Assignee: Corning Incorporated, Corning, NY (US)

( * ) Notice: Subject to any disclaimer, the term of this patent is extended or adjusted under 35 U.S.C. 154(b) by 190 days.

(21) Appl. No.: 12/789,936

(22) Filed: May 28, 2010

(65) Prior Publication Data

US 2011/0292957 A1 Dec. 1, 2011

(51) Int. Cl.
*H01S 5/00* (2006.01)
(52) U.S. Cl. .......... 372/45.011; 372/44.011; 372/45.012
(58) Field of Classification Search ............. 372/45.011, 372/44.011, 45.012
See application file for complete search history.

(56) References Cited

U.S. PATENT DOCUMENTS

| | | | |
|---|---|---|---|
| 2002/0172820 A1 | 11/2002 | Majumdar et al. | 428/357 |
| 2002/0175408 A1 | 11/2002 | Majumdar et al. | 257/734 |
| 2005/0054004 A1 | 3/2005 | Alivisatos et al. | 435/7.1 |
| 2008/0188063 A1 | 8/2008 | Alivisatos et al. | 438/483 |
| 2010/0003516 A1 | 1/2010 | Majumdar et al. | 426/368 |
| 2010/0046567 A1 | 2/2010 | Liliental-Weber et al. | 372/45.011 |
| 2010/0051900 A1 | 3/2010 | Huffaker et al. | 257/13 |
| 2011/0013657 A1 | 1/2011 | Sumitomo et al. | 372/45.01 |
| 2011/0182311 A1* | 7/2011 | Yoshizumi et al. | 372/44.011 |
| 2011/0216795 A1* | 9/2011 | Hsu et al. | 372/44.011 |
| 2012/0008660 A1* | 1/2012 | Fujii et al. | 372/45.01 |

FOREIGN PATENT DOCUMENTS

WO 2010/131511 11/2010

OTHER PUBLICATIONS

Tyagi et al., "Partial strain relaxation via misfit dislocation generation at heterointerfaces AlnGaN epitaxcial layers grown on semipolar (11-22) GaN free standing substrates", Appl. Phys. Letters vol. 95, 251905 (2009).
Yamaguchi, "Theoretical investigation of polarization properties in InGaN quantum well on semipolar and nonpolar substrates", invited speaker at Sullivan Park, Presentation at Jan. 22, 2010.
Enya et al., "531 nm Green Lasing of InGaN Based Laser Diodes on Semi-Polar (20-21) Free Standing GaN Substrates", Appl. Phys. Express, vol. 2 (2009) 082101.
Yoshizumi et al., "Continuous-Wave Operation of 520 nm Green InGaN-Based Laser Diodes on Semi-Polar (20-21) GaN Substrates", Appl. Phys. Express, vol. 2 (2009) 092101.
Tyagi et al., "AlGaN-Cladding Free Green Semipolar GaN Based Laser Diode with Lasing Wavelength of 506.4 nm", Appl. Phys. Express, vol. 3 (2010) 011002.
"Kaai Pushes Nitride Lasers on to 525 nm", Compound Semiconductor Magazine, Feb. 10, 2010.

* cited by examiner

*Primary Examiner* — Kinam Park
(74) *Attorney, Agent, or Firm* — Bruce P. Watson

(57) ABSTRACT

A GaN-based edge emitting laser is provided comprising a semi-polar GaN substrate, an active region, an N-side waveguiding layer, a P-side waveguiding layer, an N-type cladding layer, and a P-type cladding layer. The GaN substrate is characterized by a threading dislocation density on the order of approximately $1 \times 10^6 / \text{cm}^2$. The strain-thickness product of the N-side waveguiding layer exceeds its strain relaxation critical value. In addition, the cumulative strain-thickness product of the active region calculated for the growth on a the relaxed N-side waveguiding layer is less than its strain relaxation critical value. As a result, the N-side interface between the N-type cladding layer and the N-side waveguiding layer comprises a set of N-side misfit dislocations and the P-side interface between the P-type cladding layer and the P-side waveguiding layer comprises a set of P-side misfit dislocations. Additional embodiments are disclosed and claimed.

22 Claims, 1 Drawing Sheet

GAN-BASED LASER DIODES WITH MISFIT DISLOCATIONS DISPLACED FROM THE ACTIVE REGION

BACKGROUND

GaN-based laserGaN-based lasers are often grown on the polar plane of a GaN substrate, which imposes strong internal fields that can hamper electron-hole recombination needed for light emission. The non-polar planes, such as the m-plane and a-plane, can be used to eliminate these fields. GaN substrates can also be cut along semi-polar crystal planes, creating much weaker internal fields and allowing for a high indium concentration in the active region, which can stretch emission wavelengths to green. Particular embodiments of the present disclosure relate to growth on the $20\bar{2}1$ crystal plane of a GaN substrate, in which case the GaN substrate can be described as defining a $20\bar{2}1$ crystal growth plane.

BRIEF SUMMARY

The present inventors have recognized that long wavelength light emitting devices grown on semi-polar GaN substrates can exhibit increased radiative efficiency. For example, efficient green laser diodes can be grown on semi-polar $20\bar{2}1$ GaN substrates and can result in homogeneous GaInN quantum wells even at high In composition. The present inventors have also recognized that heteroepitaxial GaInN and GaAlN layers grown on GaN substrates in such devices will typically experience significant mechanical stresses because of the large lattice mismatch between GaN and InN or GaN and AlN. More specifically, misfit strain energy builds up during growth of the heteroepitaxial layers, and plastic relaxation via misfit dislocation generation can occur if the layer thickness exceeds the strain relaxation critical value of the layer. These misfit dislocations, which are generated when strained layers are grown on semipolar GaN substrates, can be sites for non-radiative recombination and can degrade laser performance if the misfit dislocations form within, or close to, the active region. According to the subject matter of the present disclosure, GaN-based laser diodes are designed such that misfit dislocations occur far away from the active region.

In accordance with one embodiment of the present disclosure, a GaN-based edge emitting laser is provided comprising a semi-polar GaN substrate, an active region, an N-side waveguiding layer, a P-side waveguiding layer, an N-type cladding layer, and a P-type cladding layer. The GaN substrate is characterized by a threading dislocation density on the order of approximately $1\times10^6/cm^2$. The strain-thickness product of the N-side waveguiding layer exceeds its strain relaxation critical value. In addition, the cumulative strain-thickness product of the active region calculated for the growth on a the relaxed N-side waveguiding layer is less than its strain relaxation critical value. As a result, the N-side interface between the N-type cladding layer and the N-side waveguiding layer comprises a set of N-side misfit dislocations and the P-side interface between the P-type cladding layer and the P-side waveguiding layer comprises a set of P-side misfit dislocations. Additional embodiments are disclosed and claimed.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which.

DETAILED DESCRIPTION

Figure 1:
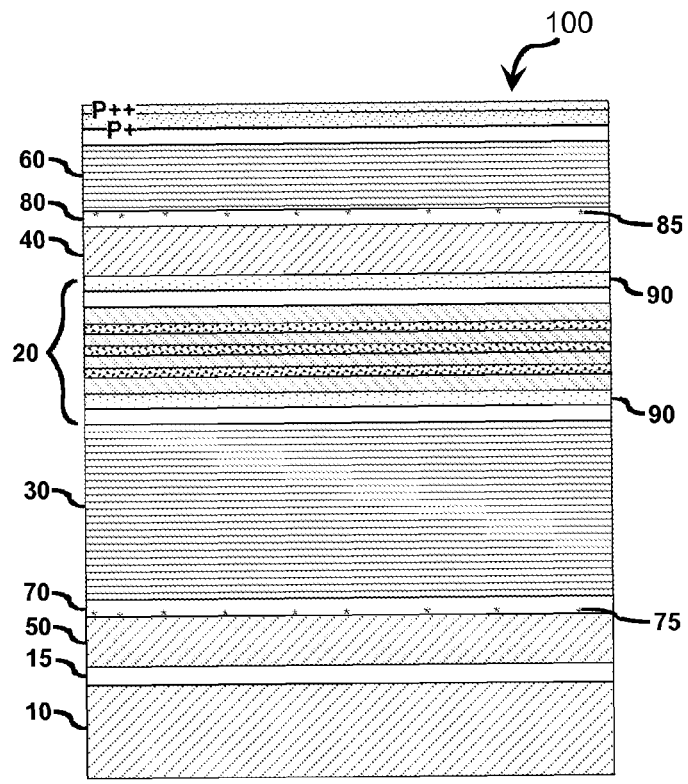
FIG. 1 illustrates a GaN edge emitting laser according to one embodiment of the present disclosure.
Figure 2:
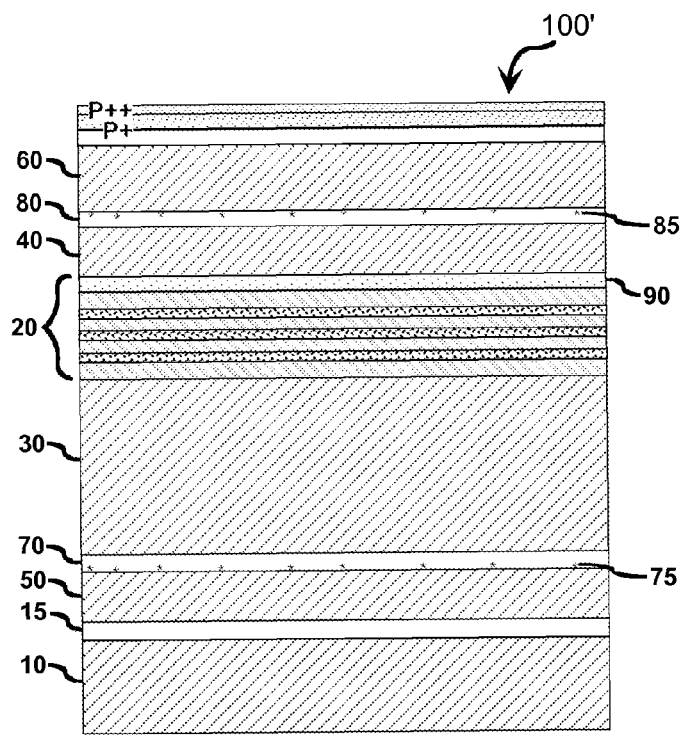
FIG. 2 illustrates one of many contemplated variations of the GaN edge emitting laser design illustrated in FIG. 1.

Referring collectively to FIGS. 1 and 2, GaN edge emitting lasers 100, 100' according to the present disclosure comprise a semi-polar GaN substrate 10, a buffer layer 15, an active region 20, an N-side waveguiding layer 30, a P-side waveguiding layer 40, an N-type cladding layer 50, and a P-type cladding layer 60. The GaN substrate 10, which may define a $20\bar{2}1$ or other semi-polar crystal growth plane, is characterized by a threading dislocation density on the order of approximately $1\times10^6/cm^2$, i.e., above $1\times10^5/cm^2$ but below $1\times10^7/cm^2$. As is illustrated in FIGS. 1 and 2, the active region 20 is interposed between and extends substantially parallel to the N-side waveguiding layer 30 and the P-side waveguiding layer 40. The N-type cladding layer 50 is interposed between the N-side waveguiding layer 30 and the GaN substrate 10. The P-type cladding layer 60 is formed over the P-side waveguiding layer 40.

The Matthews-Blakeslee equilibrium theory, which is well documented in the art, provides predictions of the critical thickness of a strained hetero-epitaxial layer for the onset of misfit dislocations. According to the theory, relaxation via misfit dislocation generation occurs if the layer thickness exceeds the Matthews-Blakeslee critical thickness of the layer. The mathematical product of this thickness and the strain in the layer is referred to herein as the strain-thickness product of the layer.

Referring to FIGS. 1 and 2 by way of illustration and not limitation, for GaN edge emitting lasers 100, 100' according to the present disclosure, the strain-thickness product of the N-side waveguiding layer 30 exceeds its strain relaxation critical value by, for example, and not by way of limitation, approximately 10%. As a result, the N-side interface, which may comprise an N-side interfacial layer 70, between the N-type cladding layer 50 and the N-side waveguiding layer 30 will comprise a set of N-side misfit dislocations 75. In addition, the strain-thickness products of each layer in the active region 20 and the cumulative strain-thickness product of the entire active region 20, i.e., the sum of the strain-thickness products for each layer in the entire active region 20 of the laser 100, 100', are less than the strain relaxation critical value. For the active region, the critical thicknesses should be calculated assuming that it is grown on a relaxed N-side waveguiding layer.

The P-side waveguiding layer 40 has an average lattice constant close to that of N-side waveguiding layer 30. As a result, during the growth of active region 20 and the P-side waveguiding layer 40, no additional strain is accumulated and, as such, no additional strain relaxation occurs. Potentially, the P-side waveguiding layer may have a complex structure. For example, it may not necessarily be made of a bulk single InGaN layer with a specific In concentration. In such cases, it is contemplated that the P-side waveguiding layer 40 can be grown such that the cumulative strain-thickness product of both the P-side waveguiding layer 40 and the active region 20, calculated for growth on a relaxed N-side waveguiding layer, is less than its strain relaxation critical value.

The P-type cladding layer 60 however may be subject to strain when grown on top of the P-type waveguiding layer 40. As is the case with the N-side interface described above, the P-side interface, which may comprise a P-side interfacial layer 80 between the P-type cladding layer 60 and the P-side waveguiding layer 40 will comprise a set of P-side misfit dislocations 85. The resulting GaN-based laser structure only includes misfit dislocations that are located relatively far away from the active region 20.

Although the subject matter of the present disclosure is primarily discussed in the context of the structure of the GaN edge emitting lasers 100, 100' illustrated in FIGS. 1 and 2, it is contemplated that the concepts of the present disclosure are equally applicable to methods of fabricating the GaN edge emitting lasers of the present disclosure. For example, as is illustrated in FIGS. 1 and 2, the N-side misfit dislocations 75 are often formed on a side of the N-side interfacial layer 70 that is proximate the N-type cladding layer. Similarly, the P-side interfacial layer 80 can be designed to be thin enough to yield P-side misfit dislocations 85 located on a side of the interfacial layer 80 that interfaces with the P-type cladding layer 60.

The N-side interfacial layer 70 and the P-side interfacial layer 80 may comprise any type of growth layer that is compatible with semi-polar GaN-based lasers. For example, the interfacial layers 70, 80 may comprise transition layers grown on the corresponding underlying layers to smoothen the underlying layer and make the transition to the material of the subsequently grown layers easier during growth. More specifically, in one contemplated embodiment, the N-side interfacial layer 70 comprises an N-type GaN transition layer under compression and layer 70 is designed so that the strain-thickness product of the N-side interfacial layer 70 is less than its strain relaxation critical value. Similarly, the P-side interfacial layer 80 may comprise a P-type GaN transition layer.

In FIGS. 1 and 2, although a variety of conventional or yet to be developed active regions are contemplated to complement the teachings of the present disclosure, the active region 20 may comprise single or multi-period quantum wells comprising compressively strained quantum wells and tensile barrier layers, which are merely illustrated as repeating layers in FIGS. 1 and 2 and are not illustrated to scale to preserve clarity. In one embodiment, the active region 20 comprises a single or multi-period quantum well structure comprising GaInN quantum wells and AlGaInN barrier layers. In which case, the N-side waveguiding layer 30 can be configured as a GaInN waveguiding layer, the In content of the GaInN quantum wells can be tailored to be greater than the In content of the N-side GaInN waveguiding layer 30, and the In content of the AlGaInN barrier layers is less than the In content of the N-side GaInN waveguiding layer. For example, in one embodiment, the In content of the active region is greater than approximately 20%.

In any case, it is contemplated that the strain-thickness product of individual ones of the compressively strained quantum wells and tensile barrier layers may preferably be less than the strain relaxation critical value of the layer. In many cases it may be preferable to ensure that the compressive strain-thickness product of the quantum wells is approximately equivalent to the tensile strain-thickness product of the barrier layers. It is also contemplated that the active region 20, the N-side waveguiding layer 30, and the P-side waveguiding layer 40 can be selected to define a substantially coherent lattice constant region that is characterized by an enhanced degree of lattice matching, relative to remaining portions of the laser structure.

Typically, the respective compositions of the P-side waveguiding layer 40 and the N-side waveguiding layer 30 are chosen to have crystal lattice periods that are relatively close to each other in a relaxed condition—at least in the direction where relaxation occurs. Although it is not required, the N-side waveguiding layer 30 is often at least as thick as the P-side waveguiding layer 40, although it should be appreciated that the N-side waveguiding layer 30 can be made thinner or thicker than the P-side waveguiding layer 40, with the understanding that thicker N-side waveguiding layers 30 are often helpful in obtaining lower loss in the waveguide structures contemplated by the present disclosure. As is illustrated, the P-side waveguiding layer 40 typically comprises a bulk waveguide structure of, for example, GaInN. In contrast, the N-side waveguiding layer 30 may comprise a GaInN bulk (see FIG. 2) or superlattice (see FIG. 1) waveguiding layer. In any case, it is often preferable to ensure that the respective waveguiding layers 30, 40 are characterized by approximately equal average In concentrations.

The N-type cladding layer 50 and the P-type cladding layer 60 may comprise a bulk crystal of GaN, AlGaN, or AlGaInN, as is illustrated in schematically in FIG. 2, or a superlattice of AlGaN/AlGaN or AlGaN/GaN, as is illustrated schematically in FIG. 1, with respect to the P-type cladding layer 60. The use of Al in the cladding layers 50 and 60 reduces the index of refraction in the cladding layers, which helps to improve optical confinement. Where the P-type cladding layer 60 and/or the N-type cladding layer comprise Al, it will typically be advantageous to ensure that the strain-thickness product of the layer exceeds its strain relaxation critical value by, for example, and not by way of limitation, at least approximately 10%.

In the embodiment of the present disclosure illustrated in FIG. 1, the GaN edge emitting laser 100 comprises current blocking layers 90 above and below the active region 20, between the active region 20 and the respective N-side and P-side waveguiding layers 30, 40. Typically, it will be sufficient to provide only the blocking layer 90 above the active region 20. In either case, the blocking layers 90 may comprise AlGaN current blocking layers. These blocking layers 90 are often under tensile strain and, in many cases, it will be advantageous to ensure that they are characterized by strain-thickness products that are less than the corresponding strain relaxation critical values of the blocking layers 90.

As is noted above, the strain-thickness product of the active region (including the blocking layers and the additional layers between the n-side and p-side waveguiding layers) should be small enough to avoid relaxation. In addition, each layer within this region should be thin enough to not relax.

GaN-based lasers are often grown on the polar plane of a GaN substrate, which imposes strong internal fields that can hamper electron-hole recombination needed for light emission. The non-polar planes, such as the m-plane and a-plane, can be used to eliminate these fields. GaN substrates can also be cut along semi-polar crystal planes, creating much weaker internal fields and allowing for a high indium concentration in the active region, which can stretch emission wavelengths to green. Particular embodiments of the present disclosure relate to growth on the $20\bar{2}1$ crystal plane of a GaN substrate, in which case the GaN substrate can be described as defining a $20\bar{2}1$ crystal growth plane.

It should also be noted that for some substrate orientations the aforementioned relaxation occurs only along the mono-directional glide plane of the GaN substrate. No glide plane is available for relaxation in the other direction. However, even relaxation in one direction is helpful in reducing the strain energy and thus assist in obtaining better quality strained layers. The misfit dislocations are confined to the interfaces and there are no additional dislocations which are created that can thread through the layers above the interface. The strain that can be relieved is limited by the original threading dislocation of the substrate. For example, if there are originally $10^6/cm^2$ threading dislocations and if the substrate dimension in the direction of the glide plane is 1 cm, then the maximum misfit dislocation density is $10^6/cm$, which implies a spacing of 10 nm and corresponds to a strain relief of approximately 2%. Higher threading dislocation densities in the original substrate can enable relaxation of greater than 2% strain but devices grown on such substrates are likely to be of poor quality and have poor reliability. For example, although a threading dislocation density on the order of $1\times10^7/cm^2$ would provide more strain relief, the resulting device would likely be of poor quality and reliability.

As is noted above, the GaN substrate 10 may define a $20\bar{2}1$ crystal growth plane and may additionally define a glide plane, in which case the strain relaxation is preferably mono-directional along the glide plane of the GaN substrate 10, which is generally in the direction projecting towards the c-axis. As is noted above, the GaN substrate 10 is typically characterized by a threading dislocation density on the order of approximately $1\times10^6/cm^2$, which is sufficient to catalyze formation of the misfit dislocations at the interfacial layer between the N-type cladding layer and the N-side waveguiding layer. More restrictively, it is contemplated that threading dislocation densities below approximately $1\times10^6/cm^2$ will often be sufficient to catalyze the aforementioned misfit dislocation formation.

For the purposes of describing and defining the present invention, it is noted that reference herein to a GaN-based laser diode should be taken to denote that the laser diode structure is grown on a GaN substrate. References herein to a GaN substrate should be taken to denote that the substrate is fabricated from high purity GaN.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the present invention it is noted that the terms "substantially" and "approximately" are utilized herein to represent the inherent degree of uncertainty that may be attributed to any quantitative comparison, value, measurement, or other representation. The terms "substantially" and "approximately" are also utilized herein to represent the degree by which a quantitative representation may vary from a stated reference without resulting in a change in the basic function of the subject matter at issue.

Having described the subject matter of the present disclosure in detail and by reference to specific embodiments thereof, it is noted that the various details disclosed herein should not be taken to imply that these details relate to elements that are essential components of the various embodiments described herein, even in cases where a particular element is illustrated in each of the drawings that accompany the present description. Rather, the claims appended hereto should be taken as the sole representation of the breadth of the present disclosure and the corresponding scope of the various inventions described herein. Further, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A GaN-based edge emitting laser comprising a semi-polar GaN substrate, an active region, an N-side waveguiding layer, a P-side waveguiding layer, an N-type cladding layer, and a P-type cladding layer, wherein:
   the GaN substrate is characterized by a threading dislocation density on the order of approximately $1\times10^6/cm^2$;
   the active region is interposed between and extends substantially parallel to the N-side waveguiding layer and the P-side waveguiding layer;
   the N-type cladding layer is interposed between the N-side waveguiding layer and the GaN substrate;
   the P-type cladding layer is formed over the P-side waveguiding layer;
   a strain-thickness product of the N-side waveguiding layer exceeds its strain relaxation critical value; a cumulative strain-thickness product of the active region calculated for growth on a relaxed N-side waveguiding layer is less than its strain relaxation critical value;
   an N-side interface between the N-type cladding layer and the N-side waveguiding layer comprises a set of N-side misfit dislocations; and
   a P-side interface between the P-type cladding layer and the P-side waveguiding layer comprises a set of P-side misfit dislocations.

2. A GaN edge emitting laser as claimed in claim 1 wherein the GaN substrate defines a $20\bar{2}1$ crystal growth plane and a glide plane and the strain relaxation is mono-directional along the glide plane of the GaN substrate.

3. A GaN edge emitting laser as claimed in claim 1 wherein the GaN substrate defines a semipolar crystal growth plane and a glide plane and the strain relaxation is mono-directional along the glide plane of the GaN substrate.

4. A GaN edge emitting laser as claimed in claim 1 wherein the threading dislocation density of the GaN substrate is sufficient to catalyze formation of the misfit dislocations at the interface between the N-type cladding layer and the N-side waveguiding layer.

5. A GaN edge emitting laser as claimed in claim 1 wherein the GaN substrate is characterized by a threading dislocation density less than approximately $1\times10^6/cm^2$.

6. A GaN edge emitting laser as claimed in claim 1 wherein:
   the active region comprises single or multi-period quantum wells comprising compressively strained quantum wells and tensile barrier layers; and
   the strain-thickness product of individual ones of the compressively strained quantum wells and tensile barrier layers is less than the strain relaxation critical value of the layer.

7. A GaN edge emitting laser as claimed in claim 1 wherein:
   the active region comprises single or multi-period quantum wells comprising compressively strained quantum wells characterized by a compressive strain-thickness product and tensile barrier layers characterized by a tensile strain-thickness product; and the compressive strain-thickness product of the quantum wells is approximately equivalent to the tensile strain-thickness product of the barrier layers.

8. A GaN edge emitting laser as claimed in claim 1 wherein the active region, the N-side waveguiding layer, and the P-side waveguiding layer define a substantially coherent lattice constant region that is characterized by an enhanced degree of lattice matching, relative to remaining portions of the laser structure.

9. A GaN edge emitting laser as claimed in claim 1 wherein:
   the active region comprises a single or multi-period quantum wells comprising GaInN quantum wells and AlGaInN barrier layers; and
   the N-side waveguiding layer comprises a GaInN waveguiding layer.

10. A GaN edge emitting laser as claimed in claim 9 wherein:
   the In content of the GaInN quantum wells is greater than the In content of the N-side GaInN waveguiding layer; and
   the In content of the AlGaInN barrier layers is less than the In content of the N-side GaInN waveguiding layer.

11. A GaN edge emitting laser as claimed in claim 1 wherein the P-side waveguiding layer and the N-side waveguiding layer comprise GaInN bulk or superlattice waveguiding layers characterized by approximately equal average In concentrations.

12. A GaN edge emitting laser as claimed in claim 1 wherein the N-type cladding layer and the P-type cladding layer comprise a bulk crystal of GaN, AlGaN, or AlGaInN or a superlattice of AlGaN/AlGaN or AlGaN/GaN.

13. A GaN edge emitting laser as claimed in claim 1 wherein:
   the P-type cladding layer and the N-type cladding layer comprise Al;
   the strain-thickness product of the P-type cladding layer exceeds its strain relaxation critical value; and
   the strain-thickness product of the N-type cladding layer exceeds its strain relaxation critical value.

14. A GaN edge emitting laser as claimed in claim 13 wherein the strain-thickness product of the N-type cladding layer exceeds its strain relaxation critical value by at least approximately 10%.

15. A GaN edge emitting laser as claimed in claim 1 wherein the N-side interface comprises an N-side interfacial layer.

16. A GaN edge emitting laser as claimed in claim 15 wherein:
   the N-side interfacial layer comprises an N-type GaN transition layer that is under compression; and
   the strain-thickness product of the N-side interfacial layer is less than its strain relaxation critical value.

17. A GaN edge emitting laser as claimed in claim 16 wherein the N-side misfit dislocations are located on a side of the N-type GaN transition layer that is proximate the N-type cladding layer.

18. A GaN edge emitting laser as claimed in claim 1 wherein the P-side interface comprises a P-side interfacial layer.

19. A GaN edge emitting laser as claimed in claim 18 wherein:
   the P-side interfacial layer comprises a P-type GaN transition layer; and
   the P-type GaN transition layer is sufficiently thin to yield P-side misfit dislocations located on a side of the P-type GaN transition layer that interfaces with the P-type cladding layer.

20. A GaN edge emitting laser as claimed in claim 1 wherein the cumulative strain-thickness product of both the P-side waveguiding layer and the active region calculated for growth on a relaxed N-side waveguiding layer is less than its strain relaxation critical value.

21. A GaN edge emitting laser as claimed in claim 1 wherein:
   the active region comprises one or more current blocking layers; and
   the strain-thickness product of the blocking layer calculated for growth on a relaxed N-side waveguiding layer is less than its strain relaxation critical value.

22. A method of fabricating a GaN edge emitting laser comprising a semi-polar GaN substrate, an active region, an N-side waveguiding layer, a P-side waveguiding layer, an N-type cladding layer, and a P-type cladding layer, wherein:
   the GaN substrate is characterized by a threading dislocation density on the order of approximately $1 \times 10^6/cm^2$;
   the active region is interposed between and extends substantially parallel to the N-side waveguiding layer and the P-side waveguiding layer;
   the N-type cladding layer is interposed between the N-side waveguiding layer and the GaN substrate;
   the P-type cladding layer is formed over the P-side waveguiding layer;
   the active layer is fabricated such that a strain-thickness product of the active region is less than its strain relaxation critical value during fabrication; the N-side waveguiding layer is fabricated such that a strain-thickness product of the N-side waveguiding layer exceeds its strain relaxation critical value during fabrication;
   an N-side interface between the N-type cladding layer and the N-side waveguiding layer comprises a set of N-side misfit dislocations; and
   a P-side interface between the P-type cladding layer and the P-side waveguiding layer comprises a set of P-side misfit dislocations.

* * * * *